(12) United States Patent
Sohda et al.

(10) Patent No.: US 8,637,820 B2
(45) Date of Patent: Jan. 28, 2014

(54) SCANNING ELECTRON MICROSCOPE AND INSPECTION METHOD USING SAME

(75) Inventors: Yasunari Sohda, Kawasaki (JP); Takeyoshi Ohashi, Tokyo (JP); Kaori Shirahata, Mitaka (JP); Keiichiro Hitomi, Delmar, NY (US)

(73) Assignee: Hitachi High-Technologies Corporation, Tokyo (JP)

( * ) Notice: Subject to any disclaimer, the term of this patent is extended or adjusted under 35 U.S.C. 154(b) by 8 days.

(21) Appl. No.: 13/521,254

(22) PCT Filed: Feb. 18, 2011

(86) PCT No.: PCT/JP2011/053440
§ 371 (c)(1),
(2), (4) Date: Jul. 10, 2012

(87) PCT Pub. No.: WO2011/108368
PCT Pub. Date: Sep. 9, 2011

(65) Prior Publication Data
US 2012/0286158 A1 Nov. 15, 2012

(30) Foreign Application Priority Data

Mar. 2, 2010 (JP) ................................. 2010-045509

(51) Int. Cl.
H01J 37/28 (2006.01)
H01J 37/147 (2006.01)
H01J 37/09 (2006.01)
H01J 37/145 (2006.01)

(52) U.S. Cl.
CPC ................. *H01J 37/28* (2013.01); *H01J 37/09* (2013.01); *H01J 37/145* (2013.01)
USPC .... 250/310; 250/306; 250/311; 250/396 ML; 250/396 R

(58) Field of Classification Search
CPC . H01J 37/28; H01J 2237/2817; H01J 37/026; H01J 37/145; H01J 37/244; H01J 37/09; G01N 23/22; G01N 23/2251
USPC ............... 250/310, 306, 311, 396 ML, 396 R
See application file for complete search history.

(56) References Cited

U.S. PATENT DOCUMENTS 4,340,481 A * 7/1982 Mishiro et al. ........... 210/500.23
6,452,175 B1 9/2002 Adamec
(Continued)

FOREIGN PATENT DOCUMENTS

JP 62-219445 A 9/1987
JP 08-138611 A 5/1996
(Continued)

OTHER PUBLICATIONS

H.C. Pfeiffer et al, "Advanced deflection concept for large area, high resolution e-beam lithography", Journal of Vacuum Science and Technology, vol. 19, No. 4, 1981, pp. 1058-1063.

*Primary Examiner* — David A Vanore
(74) *Attorney, Agent, or Firm* — Miles & Stockbridge P.C.

(57) ABSTRACT

Provided is a high-resolution scanning electron microscope with minimal aberration, and equipped with an electro-optical configuration that can form a tilted beam having wide-angle polarization and a desired angle, without interfering with an electromagnetic lens. In the scanning electron microscope, an electromagnetic deflector (201) is disposed above a magnetic lens (207), and a control electrode (202) that accelerates or decelerates electrons is provided so at to overlap (in such a manner that the height positions overlap with respect to the vertical direction) with the electromagnetic deflector (201). In wide field polarization, electrodes are accelerated, and in tilted beam formation, electrons are decelerated.

19 Claims, 7 Drawing Sheets

(56) References Cited

U.S. PATENT DOCUMENTS

| | | | |
|---|---|---|---|
| 6,614,026 B1 * | 9/2003 | Adamec | 250/398 |
| 6,825,475 B2 * | 11/2004 | Petrov et al. | 250/396 ML |
| 7,034,297 B2 * | 4/2006 | Petrov et al. | 250/310 |
| 7,170,068 B2 * | 1/2007 | Petrov et al. | 250/398 |
| 7,223,974 B2 * | 5/2007 | Petrov et al. | 250/310 |
| 7,525,091 B2 * | 4/2009 | Petrov et al. | 250/310 |
| 7,679,056 B2 * | 3/2010 | Yamanashi et al. | 250/310 |
| 7,800,062 B2 * | 9/2010 | Goldenshtein et al. | 250/310 |
| 8,158,937 B2 * | 4/2012 | Koizumi et al. | 250/306 |
| 2012/0273677 A1 * | 11/2012 | Tuma et al. | 250/307 |
| 2013/0075604 A1 * | 3/2013 | Bean et al. | 250/306 |

FOREIGN PATENT DOCUMENTS

| | | |
|---|---|---|
| JP | 8-195345 A | 7/1996 |
| JP | 11-162384 A | 6/1999 |
| JP | 2000-348658 A | 12/2000 |
| JP | 2001-15055 A | 1/2001 |
| JP | 2006-294962 A | 10/2006 |

* cited by examiner

SCANNING ELECTRON MICROSCOPE AND INSPECTION METHOD USING SAME

TECHNICAL FIELD

The present invention relates to a scanning electron microscope for use in inspection and measurement, and an inspection method using the same.

BACKGROUND ART

A scanning electron microscope (SEM) using electron beams for use in observation, inspection and measurement accelerates an electron emitted from an electron source and irradiates a sample with the electron focused by an electrostatic lens or a magnetic lens. This electron is called a primary electron. The primary electron thus incident on the sample produces a secondary electron and a reflective electron. The secondary electron and the reflective electron are detected while scanning with deflected electron, whereby a scanning image of a fine pattern and a composition distribution on the sample can be obtained. (For example, see Patent Literatures 1 and 2, and Non Patent Literature 1.)

CITATION LIST

Patent Literatures

Patent Literature 1: Japanese Unexamined Patent Application Publication No. 2000-348658
Patent Literature 2: Japanese Unexamined Patent Application Publication No. 8-138611

Non Patent Literature

Non Patent Literature 1: Journal of Vacuum Science and Technology, Vol. 19, No. 4, (1981), p 1058-p 1063

SUMMARY OF INVENTION

Technical Problem

Desired functions of the scanning electron microscope are (1) a capability of scanning in a wide field of view and (2) a capability of providing an image with a tilted beam, on the condition that those functions are available without significantly deteriorating the resolution of electron beams. Due to a growing miniaturization of semiconductor devices advances, there arises a need of a two dimensional high-speed inspection of the resist line, which requires scanning in a wide field of view to provide a larger inspection area and reduce the shrinkage. Further, along with an ongoing tendency toward a three-dimensional device structure, there is a need of formation of a tilted beam for a three-dimensional inspection. To achieve such objects, a deflection aberration resulting from the deflection of electron beams needs to be reduced.

Patent Literature 1 and Non Patent Literature 1 disclose technologies which arrange multiple electromagnetic deflectors so as to overlap cuts between magnetic materials of the magnetic lens right above the sample or a magnetic field of an electron lens. Further Patent Literature 2 discloses an example which disposes multiple electromagnetic deflectors so as to overlap a magnetic field of an electron lens as well. However, to achieve a high on-axis resolution, inner diameter Of the lens and distance to the sample need to be reduced. In this regard, the above conventional methods of arranging the magnetic lens and the electromagnetic deflectors by overlapping each other (for example, at height positions overlapping each other in a vertical direction) have problems in that it is physically difficult to install electromagnetic deflectors and also that it is difficult to achieve a wide-field deflection and a tilted beam having a desired angle in a configuration with electromagnetic deflectors arranged in the same manner.

An object of the present invention is to provide a scanning electron microscope providing a small aberration and a high resolution and capable of achieving a wide-field deflection and a tilted beam having a desired angle, and an inspection method using the same.

Solution to Problem

According to an aspect of the present invention for achieving the above object, a scanning electron microscope comprises an electron source, an magnetic lens configured to focus electron beams emitted from the electron source and irradiate a sample therewith, means for obtaining an image of the sample based on a secondary electron signal and a reflective electron produced by the sample, electromagnetic deflectors disposed above the magnetic lens, and a control electrode disposed apart from the electromagnetic deflectors at a height position overlapping height positions of the electromagnetic deflectors in a vertical direction, and configured to accelerate or decelerate the electron beams.

According to another aspect of the present invention, a scanning electron microscope'comprises an magnetic lens configured to focus electron beams emitted from the electron source and irradiate a sample therewith, means for obtaining an image of the sample based on a secondary electron signal and a reflective electron produced by the sample, and a two-step control electrode disposed apart from the electromagnetic deflectors at a height position overlapping height positions of the electromagnetic deflectors in a vertical direction, and configured to accelerate or decelerate the electron beams.

According to a further aspect of the present invention, an inspection method using the scanning electron microscope comprises the steps of: accelerating the electron beam by the control electrode and irradiating the sample therewith, and obtaining an image of the sample based on a secondary electron signal and a reflective electron produced by the sample.

According to a still further aspect of the present invention, an inspection method using the scanning electron microscope comprises the steps of: decelerating the electron beam by the control electrode and irradiating the sample therewith in an oblique direction, and obtaining an image of the sample based on a secondary electron signal and a reflective electron produced by the sample.

Advantageous Effects of Invention

The above configuration represented by the electromagnetic deflectors disposed above the magnetic lens and the control electrode disposed at a height position overlapping height positions of the electromagnetic deflectors in a vertical direction provides a scanning electron microscope with a small aberration and a high resolution and capable of achieving a wide-filed deflection and a tilted beam having a desired angle, and an inspection method using the same.

DESCRIPTION OF EMBODIMENTS

The present invention is characterized by electromagnetic deflectors disposed above an magnetic lens right above a sample, and an electrode disposed so as to overlap the electromagnetic deflectors (for example, in such a manner that a height position of the electrode overlaps height positions of the electromagnetic deflectors), and configured to accelerate or decelerate electrons. That is, the present invention is characterized by the magnetic lens disposed above the magnetic lens right above the sample so as to overlap the electromagnetic deflectors.

The electrodes disposed in such a manner enable control of electron energy in an area in which the electromagnetic deflector acts, whereby deflection chromatic aberration due to the electromagnetic deflector can be controlled. In consequence, a wide-field deflection and a tilted beam having a desired angle can be achieved without interfering with the magnetic lens.

Hereinafter, the present invention is described in detail by using embodiments thereof.

First Embodiment

A first embodiment is described with reference to FIGS. 1 to 3, FIG. 7 and FIG. 8.

Figure 1:
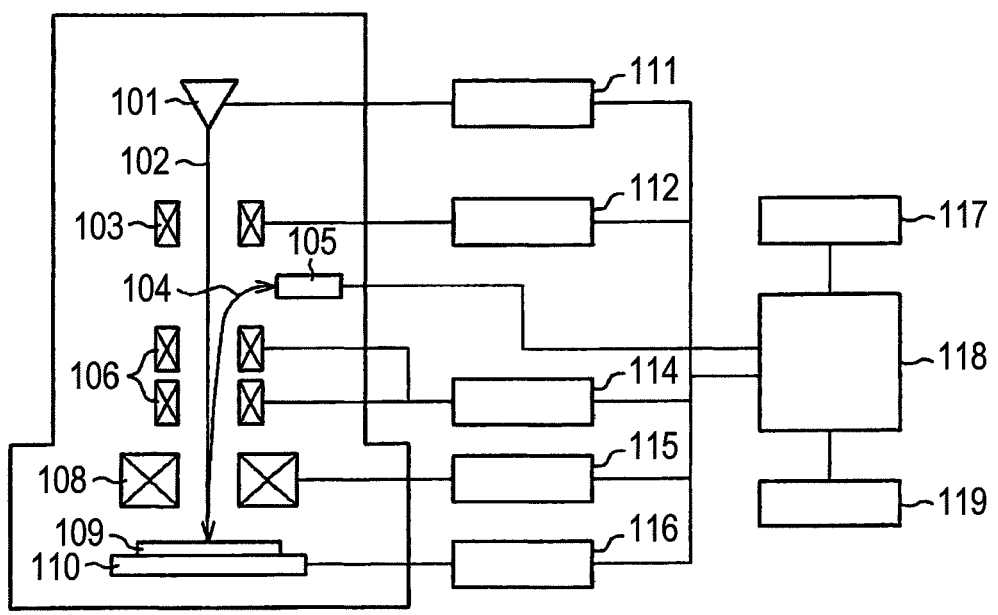
FIG. 1 is a schematic diagram of a scanning electron microscope according to a first embodiment.

FIG. 1 is an overall schematic diagram of a scanning electron microscope according to a first embodiment. An electron beam 102 emitted from an electron gun 101 is focused on a sample by a condenser lens 103 and a magnetic lens 108. According to the present embodiment, an objective lens mainly comprises the magnetic lens 108 and an electrostatic lens generated by an electric field between the magnetic lens 108 and a sample 109. A secondary electron and a reflective electron 104 emitted from the sample are detected by a detector 105 disposed therebetween. Electron beams on the sample are scanned two-dimensionally by an electromagnetic defector 106, and consequently a two dimensional image can be obtained. The two dimensional image is displayed on a display unit 119.

The scanning electron microscope further comprises a holder 110 on which the sample is placed, and electron gun controller 111, a condenser lens controller 112, a scan deflector controller 114, an magnetic lens controller 115, a sample voltage controller 116, a storage device 117, and a control operation unit 118 for entire system.

Figure 2:
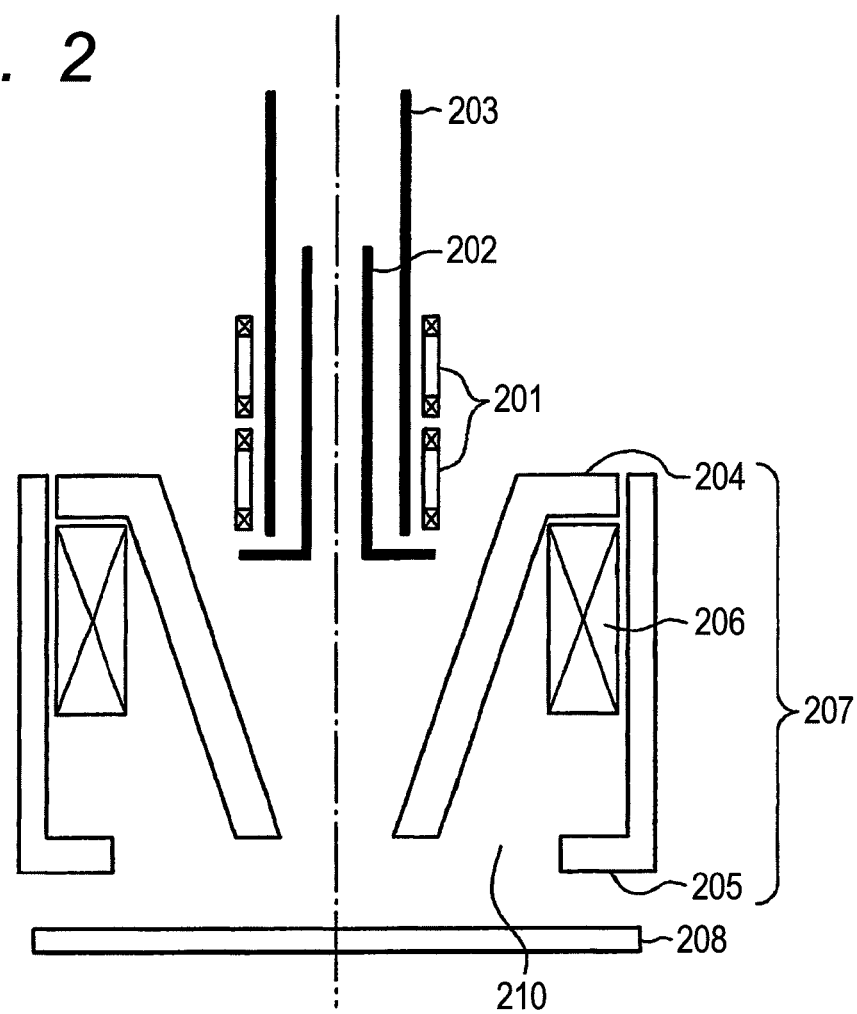
FIG. 2 is a cross-sectional view of a main electro-optical system of the scanning electron microscope according to the first embodiment.
Figure 3:
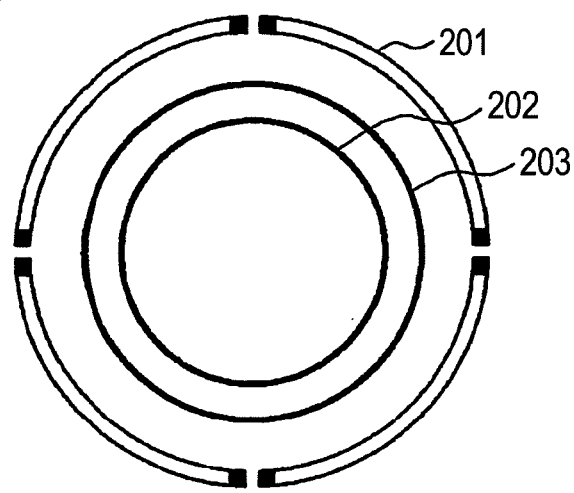
FIG. 3 is a cross-sectional view of a main electro-optical system of the scanning electron microscope according to the first embodiment.

FIG. 2 and FIG. 3 show part of the electron optics in the apparatus, in which FIG. 2 is a schematic cross-sectional view, and FIG. 3 is a top view. As shown in FIG. 2, an electromagnetic deflector 201 is disposed at two stages to link with each other, and a control electrode 202 capable of accelerating or decelerating the electron is disposed inside the electromagnetic deflectors 201 at a position overlapping positions of the electromagnetic deflectors 201 (at a height position overlapping each other in a vertical direction). As shown in FIG. 3, the control electrode has a cylindrical inner shape and accelerates or decelerates the electron by applying an electric potential. As shown in FIG. 2, a lower end of the control electrode lies above an aperture 210 of a magnetic material of the magnetic lens 207 right above the sample to avoid interference with the magnetic lens.

The magnetic lens 207 has a large size and comprises an upper magnetic circuit 204 including a magnetic material, a lower magnetic circuit 205, and a magnetic coil 206. A positive electric potential is applied to part of the magnetic material (upper magnetic circuit) 204 of the magnetic lens to reduce an on-axis aberration by accelerating the electron. Further, an additional electrode 203 exists above an upper end of the control electrode according to the present embodiment as well. In consequence, an electrostatic lens comprising three electrodes overlaps the electromagnetic deflectors. According to the present embodiment, the upper electrode is a grounding electrode. Reference sign 208 refers to the sample.

One of advantageous, effects of the control electrode according to the present embodiment is control of the deflection chromatic aberration. In the scanning electron microscope, the deflection chromatic aberration is a most important aberration among deflection aberrations. There exist two deflection chromatic aberrations: a deflection chromatic aberration due to the deflector caused when an difference in the deflection sensitivity of the deflector arises due to a difference in the electron velocity, and a deflection chromatic aberration due to the lens caused when a difference in the focal length of the lens arises due to a difference in the electron velocity. An ultimate deflection chromatic aberration is a sum of the two deflection chromatic aberrations. Therefore, a change in the deflection chromatic aberration due to the deflector changes the ultimate deflection chromatic aberration.

Figure 7:
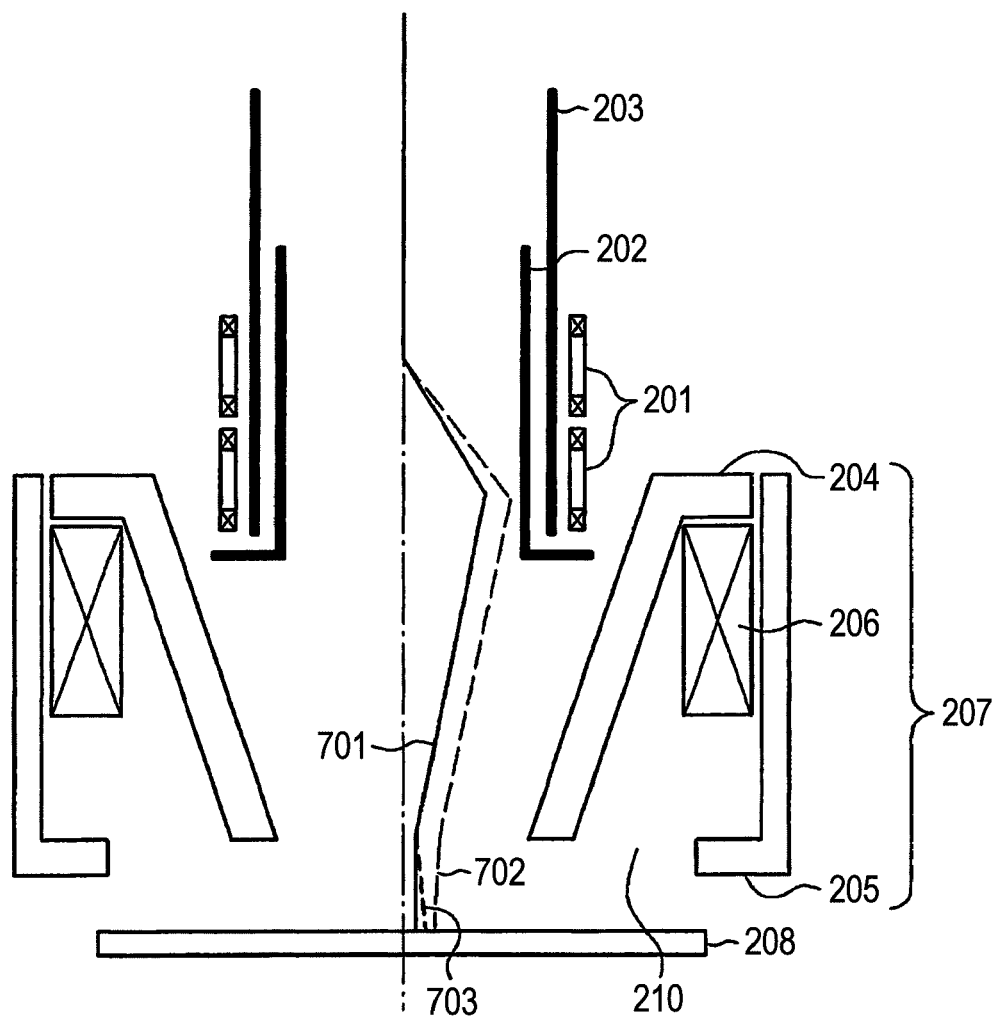
FIG. 7 is an electron trajectory diagram showing wide-field deflection.

FIG. 7 shows a conceptual diagram of electron trajectories. A low speed electron having a low energy relative to a high speed electron trajectory A 701 is subjected to both a significant deflection-action of the deflector and a significant lens action of the lens. A low speed electron trajectory A 702 in FIG. 7 is a trajectory when subjected only to a significant deflection action, whereas a low speed electron trajectory B 703 is a trajectory when subjected only to a significant lens action. Differences in the position between respective low speed trajectories and the high speed trajectory on the sample represent the deflection chromatic aberration; that is, a chromatic aberration due to the deflector, and a chromatic aberration due to the lens, respectively. In the case that an incidence is close to a vertical direction necessary for image acquisition in a wide field shown in FIG. 7, both of the low speed trajectories are deviated in a positive direction (in a direction causing a larger deflection). That is, the low speed trajectories act to accumulate achromatic aberration due to the lens to a chromatic aberration due to the deflector, as well.

Accordingly, accelerating electrons by applying a positive electric potential to the control electrode reduces the deflection chromatic aberration due to the deflector and thereby prevents deterioration of the resolution due to deflection in a wide view field. According to the present embodiment, there are few physical limitations since the electromagnetic deflectors 201 and the control electrode 202 are disposed apart from the magnetic lens. Therefore, the magnetic lens 207 is capable of providing a high resolution with a short focal length.

Another advantageous effect of the present embodiment is reduction of the deflection chromatic aberration due to the lens, although not shown in FIG. 7. Without the control electrode according to the present embodiment, an electric potential difference between the additional electrode 203 and part of the magnetic material (upper magnetic circuit) of the magnetic lens 207 causes an electrostatic effect at an area below the electromagnetic deflectors 201. An electron deflected by electromagnetic deflectors passes the off-axis in this area and thereby causes a deflection chromatic aberration due to the lens.

The deflection chromatic aberration due to the lens occurs mainly in the vicinity of the sample, although a specific amount of the deflection chromatic aberration due to the lens also occurs constantly in this area. According to the present embodiment, the electric potential difference between the additional electrode 203 and part of the magnetic material (upper magnetic circuit) 204 is reduced by applying a voltage to the control electrode 202. The reduction of electric potential difference decreases lens effects and thereby enables a reduction of the deflection chromatic aberration due to the lens. That is, as a result of the reduction of electric potential difference, electromagnetic deflectors 201 are brought into the electrostatic lens above the magnetic lens 207, so that an aberration reduction effect by an in-lens deflection can be obtained.

Further, according to the present embodiment, the additional electrode 203 exists between the electromagnetic deflectors 201 and the control electrode 202. That is, two electrodes exist in a double layer inside the electromagnetic deflectors 201 at a height position overlapping height positions of the electromagnetic deflectors 201. According to the present embodiment, the electron is accelerated or decelerated by the control electrode 202, an inner electrode out of the double-layer electrodes. The additional electrode 203 on the outer side is grounded and serves as a vacuum division wall to keep a passage of electron beams in a vacuum state. This construction provides such effect that control of the electron beam by the vacuum division wall and another electrode enables grounding of the vacuum division wall and a simple mechanical structure. Further, the control electrode 202 has a construction extending outward at a lower end thereof to shield an electron beam passage area from an external electric potential. This ensures the effects of the control electrode 202.

In the above configuration according to the present embodiment, 3 KV, 6 KV and −2.2 KV were applied to the control electrode 202, part of the magnetic material and the sample 208 respectively. Electron beams, which pass through the condenser lens at the energy of 3 KV, are accelerated to about 6 KV in the vicinity of the electromagnetic deflectors 201 and to about 9 KV at an area above the magnetic lens 207, and are finally decelerated to 800V when reaching the sample 208. When a wide field of 50 μm square was deflected by the electromagnetic deflectors 201, the resolution was 3 nm. This indicates that a resolution higher than a conventional resolution of 5 nm was made possible. According to measurements of the size of silicon having about 100 nm wide line, by using this apparatus, uniformity within the view field could be significantly improved from a conventional level of ±1 nm to ±0.2 nm.

Further, according to the present embodiment, electrons can be conversely decelerated by applying a negative electric potential to the control electrode so that the deflection chromatic aberration due to the deflector can be increased.

Figure 8:
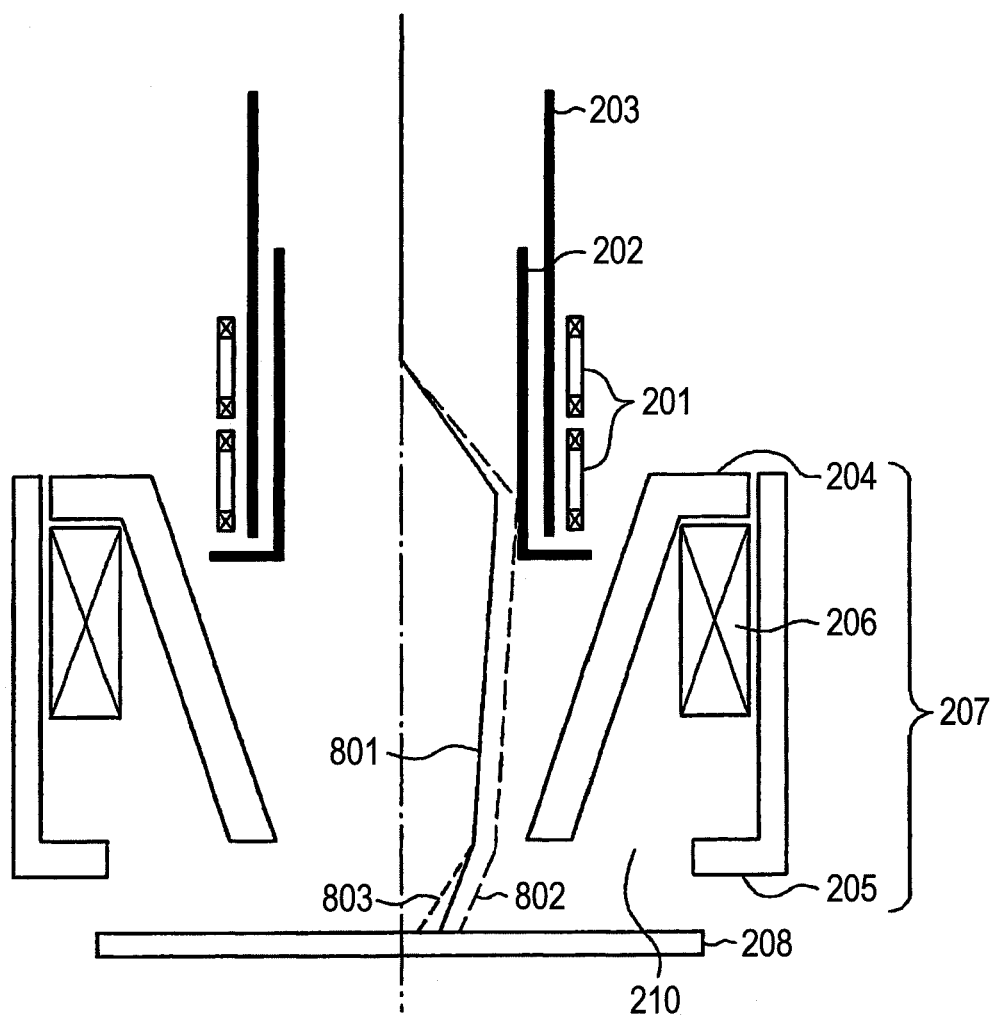
FIG. 8 is an electron trajectory diagram, showing a tilted beam.

FIG. 8 shows electron trajectories when tilted beams were formed. A low speed electron trajectory C 802 represents a tilted beam subjected to a significant deflection action only, and a low speed electron trajectory D 803 represents a tilted beam subjected to a significant lens action only. For tilted beams, deviations between the low speed electron trajectory D 803 and a high speed electron trajectory B 801 are reverse to deviations between the low speed electron trajectory C and the high speed electron trajectory B.

That is, the resolution of the tilted angle can be improved by offsetting a deflection chromatic aberration due to the lens occurring when forming a tilted beam having a chromatic aberration due to the lens, with a deflection chromatic aberration due to the deflector. Here exists a correlation between the tilted angle and the chromatic aberration due to the lens. The larger chromatic aberration is offset, the larger tilted angle can be obtained.

A resolution of an electron beam tilted by four degrees could be made 3 nm by applying −1.5 KV, 6 KV and −2.2 KV to the control electrode 202, part of the magnetic material and the sample respectively. This is a significant improvement of the resolution compared with a conventional resolution of 7 nm. This enables a side-wall observation of a reversely tapered line pattern and thereby achieves control of a taper angle.

In such a manner, the present embodiment not only enables a wide-field deflection and a tilted beam but also allows switching of a mode just by changing the electric potential of the control electrode 202 in accordance with respective modes. Specifically, the electron beam is accelerated in the wide-field mode and decelerated in the tilted beam mode. The present embodiment is also characterized in that the modes can be switched without causing an interference with the magnetic lens since the control electrode is disposed above the magnetic lens.

As described above, the present embodiment could provide a scanning electron microscope providing a small aberration and a high resolution and capable of achieving a wide-field deflection and a tilted beam having a desired angle, and an inspection method using the same.

Second Embodiment

A second embodiment is described with reference to FIG. 4. Items described in the first embodiment but not in the present embodiment may also apply to the present embodiment unless the circumstances are exceptional.

Figure 4:
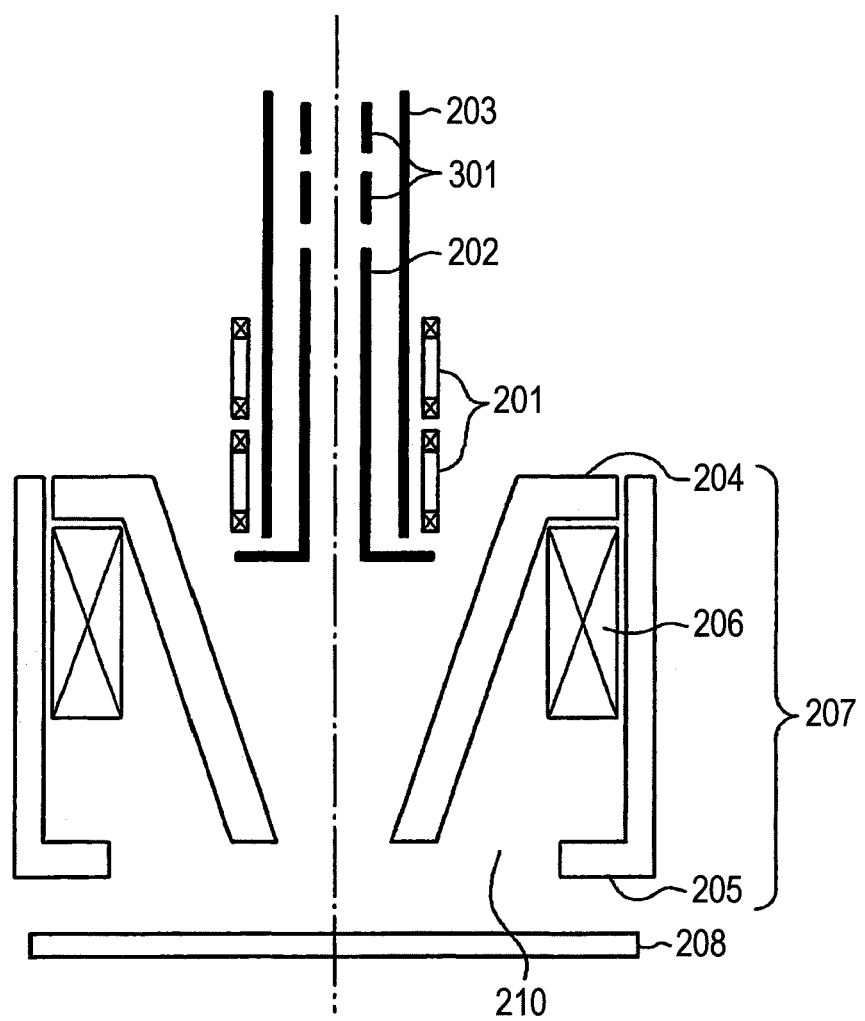
FIG. 4 is a cross-sectional view of a main electro-optical system of the scanning electron microscope according to a second embodiment.

FIG. 4 shows a cross-sectional view of main components in an electro-optical configuration of a scanning electron microscope according to the present embodiment. An overall configuration of the apparatus is same as the first embodiment. According to the present embodiment, the electrostatic deflectors 301 are disposed above the control electrode 202. The electrostatic deflectors 301 are configured to perform a micro deflection. According to the present embodiment, the electromagnetic deflectors 201 deflect electron beams on the sample significantly and thereafter electrostatic deflectors at two stages perform two dimensional scanning in conjunction with each other. Electrostatic deflectors 301 are capable of increasing the scan speed (about four times the scan speed of the electromagnetic deflector) and thus are effective to suppress charging of an insulator sample.

With two deflecting means combined in such a manner, a substantial wide-field observation can be made possible. However, electrostatic deflectors are disposed above the control electrode in order to prevent interference between the electrostatic deflectors and the control electrode. The electrostatic deflector used in the present embodiment is an octupole electrostatic deflector.

In the present embodiment, 3 KV, 6 KV and −2.9 KV were applied to the control electrode, part of the magnetic material and the sample respectively. As a result, energy of the irradiation electron became 100 V. As an object of the present embodiment is to measure a resist line, the energy was reduced in order to reduce damages. The deflection chromatic aberration tends to increase as the electron velocity becomes lower. According to the present embodiment, a resolution of 3.5 nm could be obtained even in a 50 µm square deflection area. Further, a shadow of charging generated on a resist image in a 1 µm square area was eliminated by a high speed scanning with the electrostatic deflection. According to measurement results of a resist line having a width of 50 nm, uniformity of ±0.25 nm could be obtained in a 50 µm square deflection area.

As described above, according to the present embodiment, the present invention could provide a scanning electron microscope providing a small aberration and a high resolution and capable of achieving a wide-field deflection and a tilted beam having a desired angle, and an inspection method using the same. Further, by providing the electrostatic deflector, a high resolution measurement could be achieved even on an insulating film pattern.

Third Embodiment

A third embodiment is described with reference to FIG. 5. Items described in the first or second embodiment but not in the present embodiment may also apply to the present embodiment unless the circumstances, are exceptional.

Figure 5:
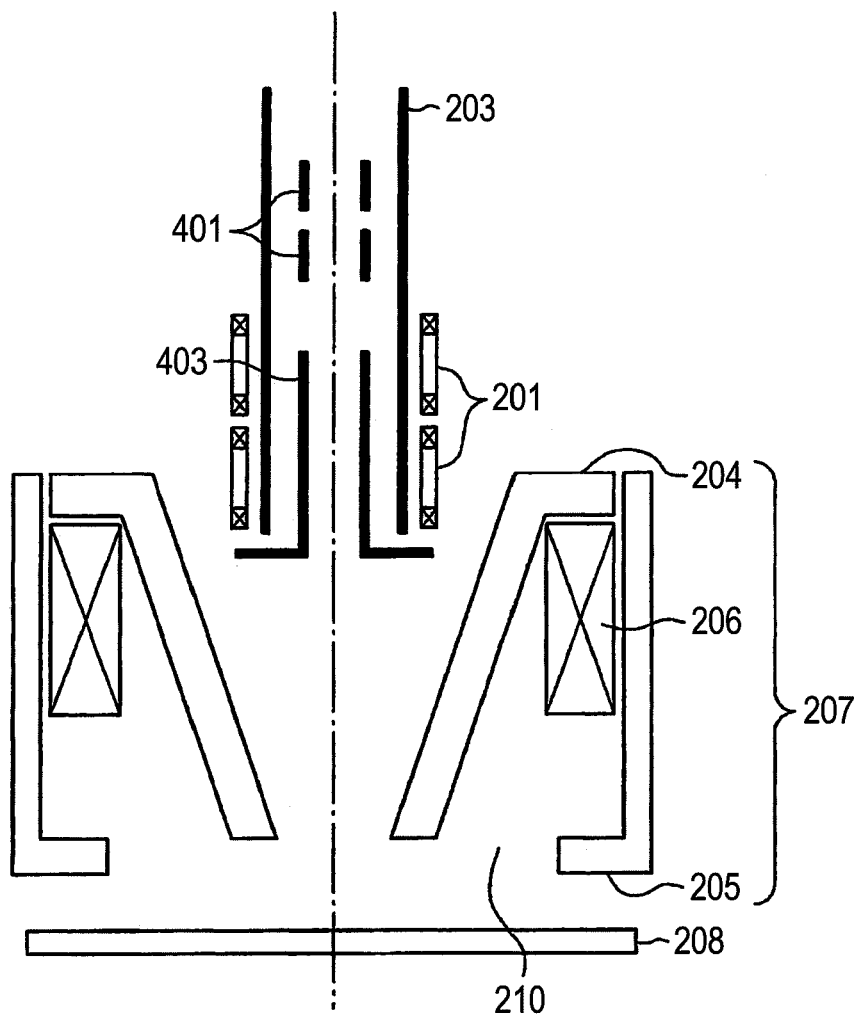
FIG. 5 is a cross-sectional view of a main electro-optical system of a scanning electron microscope according to a third embodiment.

FIG. 5 shows a cross-sectional view of main components in an electro-optical configuration of a scanning electron microscope according to the present embodiment. An overall configuration of the apparatus is same as the first embodiment. According to the present embodiment, a control electrode 403 is shorter and the position thereof overlaps positions of the electromagnetic deflector 201, but does not cover the electromagnetic deflectors 201 entirely. Effects of the present embodiment can be obtained just by partially superposing the control electrode 403 over the electromagnetic deflectors 201. The shortened control electrode 403 provides an effect of increasing the freedom degree of the position of the electrostatic deflectors 401. According to the present embodiment, the deflection sensitivity can be increased by lowering the position of the electrostatic deflectors 401.

According to the present embodiment, 2 KV, 5 KV and −1.4 KV were applied to the control electrode 403, a second control electrode and the sample respectively, and a resolution of 3.3 nm was obtained when a 50 µm square. As a result, a resolution higher than a conventional resolution of 5 nm was made possible. According to measurements of the size of silicon having about a 100 nm-wide line by using this apparatus, uniformity within the view field could be significantly improved to ±0.23 nm.

As described above, according to the present embodiment, the present invention could provide a scanning electron microscope providing a small aberration and a high resolution and capable of achieving a wide-field deflection and a tilted beam having a desired angle, and an inspection method using the same. Further, by shortening the control electrode and disposing the electrostatic deflectors and the electromagnetic deflectors closer to each other, the deflection sensitivity could be increased and a high resolution measurement could be performed.

Fourth Embodiment

A fourth embodiment is described with reference to FIG. 6. Items described in the first and second embodiments but not in the present embodiment may also apply to the present embodiment unless the circumstances are exceptional.

Figure 6:
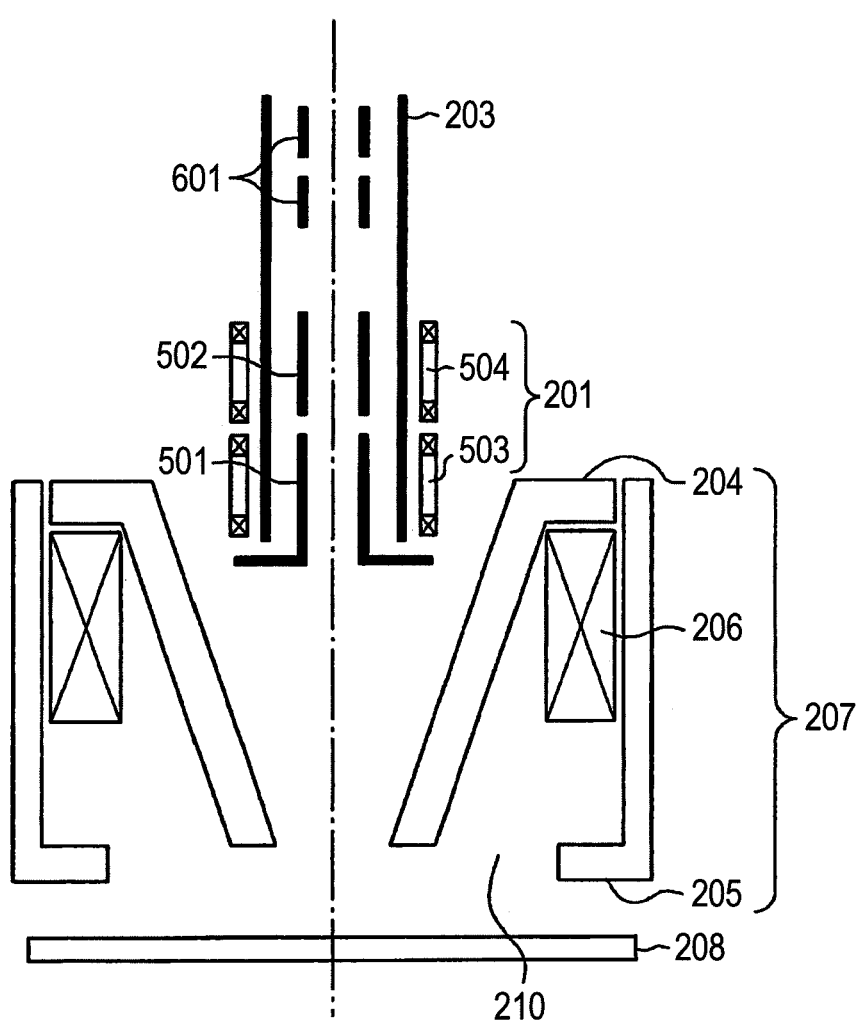
FIG. 6 is a cross-sectional view of a main electro-optical system of a scanning electron microscope according to a fourth embodiment.

FIG. 6 shows a cross-sectional view of a part of an electro-optical configuration of a scanning electron microscope according to the present embodiment. An overall configuration of the apparatus is same as the first embodiment. According to the present embodiment, the control electrode is divided into two parts; an upper control electrode 502 and a lower control electrode 501. A different electric potential could be applied to respective electrodes so that more sophisticated electron velocity control is possible.

The upper control electrode 502 is disposed so as to overlap an upper deflector 504 of the electromagnetic deflector, and the lower control electrode 501 is disposed so as to overlap a lower deflector 503 of the electromagnetic deflector. This configuration enables control of the electron velocity by respective deflectors.

In the present embodiment, 2.8 KV, 3 KV, 6 KV and −2.7 KV were applied to the upper control electrode 502, the lower control electrode, part of the magnetic material (upper magnetic circuit) and the sample respectively, and a resolution of 2.8 nm was obtained when 50 µm square was deflected by the electromagnetic deflectors. This achieves a high resolution scanning in a wide view field.

Further, by applying −1.8 KV, −1.5 KV, 6 KV and −2.7 KV to the upper control electrode, the lower control electrode, part of the magnetic material (upper magnetic circuit) and the sample respectively, a resolution of 3 nm could be obtained when the electron beam was tilted by five degrees.

Further, according to the present embodiment, an octupole two-stage electrostatic deflector is adopted as an offset superimposed electrostatic deflector 601 in order to add a same offset voltage to deflection voltages of respective electrodes of the electrostatic deflectors. This enables reduction of chromatic aberration due to the electrostatic deflector and reduction of lens effect between the electrostatic deflector and the control electrode and thereby provides an effect of reducing the deflection chromatic aberration in the electrostatic deflection. Here, the chromatic aberration in the electrostatic deflection could be reduced to ½ of a conventional chromatic aberration by applying an offset voltage of 2.8 KV.

As described above, according to the present embodiment, the present invention could provide a scanning electron microscope providing a small aberration and a high resolution and capable of achieving a wide-field deflection and a tilted beam having a desired angle, and an inspection method using the same. Further, the aberration in the electrostatic deflection could be reduced by using the offset superimposed electrostatic deflector.

Control electrodes according to the embodiments described above have a continuous construction on a circumference. However, it will be understood by those skilled in the art that a similar effect can be obtained even when a control electrode is divided in a rotating direction. In this case, respective control electrodes can be used as electrostatic deflectors by applying a common voltage other than the offset voltage. Since the electrostatic deflectors also serve as control electrodes, space occupied by optical elements and the number of wirings can be reduced.

List of Reference Signs

101 . . . Electron gun
102 . . . Electron source
103 . . . Condenser lens
104 . . . Secondary electron and reflective electron
105 . . . Detector
106 . . . Electromagnetic deflector
108 . . . Magnetic lens
109 . . . Sample
110 . . . Holder 111 ... Electron gun controller
112 ... Condenser lens controller
114 ... Scan deflector controller
115 ... Magnetic lens controller
116 ... Sample voltage controller
117 ... Storage device
118 ... Control operation unit for entire apparatus
119 ... Display unit
201 ... Electromagnetic deflector
202 ... Control electrode
203 ... Additional electrode
204 ... Part (upper magnetic circuit) of magnetic material
205 ... Lower magnetic circuit
206 ... Magnetic coil
207 ... Magnetic lens
210 ... Aperture of magnetic material
301 ... Electrostatic deflector
401 ... Electrostatic deflector
403 ... Control electrode
501 ... Lower control electrode
502 ... Upper control electrode
503 ... Lower deflector
504 ... Upper deflector
601 ... Offset superimposed electrostatic deflector
701 ... High speed electron trajectory A
702 ... Low speed electron trajectory A
703 ... Low speed electron trajectory B
801 ... High speed electron trajectory B
802 ... Low speed electron trajectory C
803 ... Low speed electron trajectory

The invention claimed is:

1. A scanning electron microscope, comprising:
an electron source;
an magnetic lens configured to focus electron beams emitted from the electron source and irradiate a sample therewith;
means for obtaining an image of the sample based on a secondary electron signal and a reflective electron produced by the sample;
an electromagnetic deflector disposed above the magnetic lens; and
a control electrode disposed apart from the electromagnetic deflector at a height position overlapping a height position of the electromagnetic deflector in a vertical direction and configured to accelerate or decelerate the electron beams.

2. The scanning electron microscope according to claim 1, further comprising an additional electrode between the electromagnetic deflector and the control electrode.

3. The scanning electron microscope according to claim 2, wherein the additional electrode is a vacuum division wall.

4. The scanning electron microscope according to claim 1, wherein the control electrode has a construction expanding outward in the vicinity of a lower end thereof.

5. The scanning electron microscope according to claim 1, wherein a second control electrode is disposed below the control electrode.

6. The scanning electron microscope according to claim 5, wherein a positive electric potential lower than a positive electric potential applied to the second control electrode and the part of the magnetic material is applied to the control electrode.

7. The scanning electron microscope according to claim 1, wherein an electric potential is applied to part of a magnetic material of the magnetic lens.

8. The scanning electron microscope according to claim 1, wherein an electrostatic deflector is disposed above the control electrode.

9. The scanning electron microscope according to claim 8, wherein an offset electric potential is applied to each pole of the electrostatic deflector.

10. The scanning electron microscope according to claim 1, wherein positive and negative electric potentials can be applied to the control electrode.

11. The scanning electron microscope according to claim 1, wherein the control electrode accelerates in a wide-view mode and decelerates in a titled beam mode.

12. An inspection method using the scanning electron microscope according to claim 1, the inspection method comprising the steps of:
accelerating the electron beam by the control electrode and irradiating the sample therewith; and
obtaining an image of the sample based on a secondary electron signal and a reflective electron produced by the sample.

13. An inspection method using the scanning electron microscope according to claim 1, the inspection method comprising the steps of:
decelerating the electron beam by the control electrode, and irradiating the sample therewith in an oblique direction; and
obtaining an image of the sample based on a secondary electron signal and a reflective electron produced by the sample.

14. A scanning electron microscope, comprising:
an electron source;
an magnetic lens configured to focus an electron beam emitted from the electron source and irradiate a sample therewith;
means for obtaining an image of the sample based on a secondary electron signal and a reflective electron produced by the sample;
an electromagnetic deflector disposed above the magnetic lens; and
a two-stage control electrode disposed apart from the electromagnetic deflector at a height position overlapping a height position of the electromagnetic deflector in a vertical direction and configured to accelerate or decelerate the electron beam.

15. The scanning electron microscope according to claim 14, wherein the electromagnetic deflector is disposed at two stages, and an upper deflector and an upper control electrode are disposed at a position overlapping each other, and a lower deflector and a lower control electrode are disposed at a position overlapping each other.

16. The scanning electron microscope according to claim 14, wherein the control electrode is of an acceleration type.

17. The scanning electron microscope according to claim 14, wherein the control electrode can be switched to the acceleration type in a wide-field mode, and to a deceleration type in a tilted beam mode.

18. An inspection method using the scanning electron microscope according to claim 14, the inspection method comprising the steps of
accelerating the electron beam by the two-stage control electrode and irradiating the sample therewith; and
obtaining an image of the sample based on a secondary electron signal and a reflective electron produced by the sample.

19. An inspection method using the scanning electron microscope according to claim 14, the inspection method comprising the steps of decelerating the electron beam by the two-stage control electrode and irradiating the sample therewith in an oblique direction; and obtaining an image of the sample based on a secondary electron signal and a reflective electron produced by the sample.

* * * * *